(12) United States Patent
Gao (10) Patent No.: US 10,653,036 B1
(45) Date of Patent: May 12, 2020

(54) SYSTEMS AND METHODS FOR IMMERSION COOLING THERMAL MANAGEMENT

(71) Applicant: Baidu USA LLC, Sunnyvale, CA (US)

(72) Inventor: Tianyi Gao, Santa Clara, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/252,511

(22) Filed: Jan. 18, 2019

(51) Int. Cl.
*H05K 7/20* (2006.01)

(52) U.S. Cl.
CPC ..... *H05K 7/20281* (2013.01); *H05K 7/20236* (2013.01); *H05K 7/20781* (2013.01); *H05K 7/20836* (2013.01); *H05K 7/20272* (2013.01)

(58) Field of Classification Search
CPC . H05K 7/20236; H05K 7/20281; H05K 7/203
See application file for complete search history.

(56) References Cited

U.S. PATENT DOCUMENTS

| 9,464,854 B2* | 10/2016 | Shelnutt | F28F 27/02 |
| 2018/0020571 A1* | 1/2018 | Saito | G06F 1/20 |

* cited by examiner

*Primary Examiner* — Mukundbhai G Patel
(74) *Attorney, Agent, or Firm* — Womble Bond Dickinson (US) LLP (57) ABSTRACT

The present disclosure provides systems and methods for immersion cooling for information technology (IT) equipment. For example, an immersion tank can receive a cooling fluid that is circulated therethrough (e.g., by a pump). Further, an IT container can be at least partially received within immersion tank, and the IT container can include a plurality of IT compartments that are configured to receive one or more IT components. The cooling fluid can be selectively provided to the IT compartments with IT equipment installed therein for cooling of the IT equipment.

18 Claims, 8 Drawing Sheets

SYSTEMS AND METHODS FOR IMMERSION COOLING THERMAL MANAGEMENT

TECHNICAL FIELD

The present disclosure is directed to systems and methods for thermal management, and more particularly, immersion cooling thermal management systems and methods for IT equipment/components. Other aspects are also described.

BACKGROUND

As the power density (e.g., thermal design power) of contemporary processors (e.g., CPUs, GPUs, etc.) increases, thermal management becomes more and more challenging, especially when multiple high-density processors are packaged in one system (e.g., into a single server). Therefore, traditional air cooling solutions (e.g., using either heat sinks or heat pipes) generally are not able to satisfy thermal management requirements. Immersion cooling, e.g., in which IT equipment/components are immersed in an immersion cooling fluid, offers one solution. Generally, there are two types of hardware solutions for immersion cooling—vertical designs and horizontal designs. Vertical designs use similar design form factors as traditional air cooling IT racks, but the servers, e.g., a 1U, 2U or 4U, etc., typically are fully contained and filled with a fluid, that is, the fluid only is contained in each individual server. These designs can be generally expensive, however, and also can put high requirements on individual server sealing, can require significant amount of fluid, can be difficult to maintain and service, and may have high failure possibilities. Known horizontal hardware designs may provide several advantages over existing vertical designs, but current horizontal designs generally are not sufficiently energy efficient, and further may have inefficient fluid usage and bad fluid management. The present disclosure is directed to an immersion cooling thermal management systems and methods that address these and other related and unrelated issues in the art.

SUMMARY

Briefly described, in one aspect, the present disclosure is directed to an immersion cooling system for thermal management of information technology (IT) components, such as servers, e.g., 1U, 2U, 4U servers, blade servers, etc.; network gears; PSUs, battery units; cables; rack management controllers, etc. The immersion cooling system can include an immersion tank with a chamber that receives a cooling fluid, and an IT container that is at least partially received within the chamber of the immersion tank. The IT container can include a plurality of compartments defined therein, with each compartment configured to receive IT equipment/components. The IT container further can have a plurality of openings defined therein and corresponding to the plurality of compartments to allow the cooling fluid to flow through plurality of compartments. The plurality of openings can be selectively opened and closed so the immersion cooling fluid is only supplied to compartments where the IT equipment/components are populated.

In addition, the immersion cooling system can have a cooling fluid supply loop (e.g., including one or more conduits) that is in communication with chamber of the immersion tank to provide the cooling fluid thereto, and a cooling fluid return loop (e.g., including one or more conduits) that also is in communication with the chamber of the immersion tank to allow the cooling fluid to exit the chamber of the immersion tank so as to facilitate circulation or recirculation of the cooling fluid. The immersion cooling system also can have a pump that is in communication with the cooling fluid return loop or the cooling fluid supply loop to drive the circulation or recirculation of the cooling fluid through the immersion tank.

The immersion cooling system also can include a control system in communication with the pump. The control system can have a fluid level sensor positioned to gather information related to a fluid level of the cooling fluid in the chamber of the immersion tank. The control system further can have a plurality of pressure sensors positioned along the plurality of compartments of the IT container to gather information related to a fluid pressure of the cooling fluid in the plurality of compartments. The control system can be configured to control the pump to maintain or change the flow of the cooling fluid based the fluid level of the cooling fluid in the chamber of the immersion tank and to maintain or change the fluid pressure in the plurality of compartments. Accordingly, the control system can help to facilitate energy efficiency, fluid usage efficiency, better fluid management, precision system control, safety operation, as well as ease of service and maintenance for the immersion cooling system.

Further still, the immersion cooling system can include a plurality of fluid gates corresponding to the plurality of openings in the IT container. The plurality of fluid gates can include one or more portions or sections that are selectively movable between a closed position, which prevents the cooling fluid from passing through the plurality of openings, and an open position, which allows the cooling fluid to pass through the plurality of openings to flow through the plurality of compartments.

In another aspect, the present disclosure is directed to a method for immersion cooling thermal management, e.g., inside an immersion tank. For example, the method can include circulating, using a pump, a cooling fluid though the chamber of an immersion tank. The method also can include providing IT equipment/components to at least one compartment of an IT container that is received within an immersion tank. Upon providing the IT equipment/components to the at least one compartment of the IT container, the method includes opening one or more fluid gates to allow the cooling fluid to flow from the chamber of the immersion tank into the at least one compartment of the IT container. The method also can include gathering, using one or more sensors, information related to a fluid level of the cooling fluid in the chamber of the immersion tank, and gathering, using one or more sensors, information related to a fluid pressure of the cooling fluid in the at least one compartment of the IT container. In addition, the method can include controlling the pump to circulate the cooling fluid through the chamber of the immersion container and the at least one compartment of the IT container if IT equipment/components are populated therein such that the fluid level or the fluid pressure is substantially maintained or substantially constant.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

Embodiments of the disclosure are illustrated by way of example and not limitation in the figures of the accompanying drawings in which like references indicate similar elements.

FIG. 4 shows the immersion cooling management system of FIG. 1, illustrating exemplary thermal conditions with the IT equipment/components turned on.

DETAILED DESCRIPTION

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

As shown generally in FIGS. 1-8, the present disclosure provides a thermal management system 10 for immersion cooling of IT equipment/components, such as servers, e.g., 1U, 2U, 4U servers, blade servers, etc.; network gears; PSUs, battery units; rack management controllers, etc. The thermal management system 10 can facilitate cooling/thermal management of IT equipment/components, while helping to facilitate energy efficiency, fluid usage efficiency, increased fluid management, precision control, and ease of service and maintenance.

FIGS. 1-8 show that the thermal management system 10 includes an immersion cooling tank or other suitable vessel 12, and an IT container or receptacle 14 received within the immersion cooling tank 12 and configured to receive/house IT equipment/components. The immersion cooling tank 12 generally includes a body 16 with a plurality of portions or walls 18 that at least partially surround and define a chamber or cavity 20 that receives the IT container 14. In one embodiment, the body 16 of the immersion cooling tank 12 has a generally cuboid shape, though other shapes, e.g., cubic, spherical, cylindrical, etc., can be used without departing from the scope of the present disclosure. The immersion cooling tank 12 can be formed from any suitable material, such as metallic, composite, polymeric, synthetic materials, etc. or combinations thereof, which is substantially heat resistant and provide long-term compatibility with suitable immersion cooling fluids.

As further shown in FIG. 1-8, the IT container 14 includes a body 22 with a plurality of portions or walls 24 that surround and define a chamber or space 26 for receiving various IT equipment/components 28 (e.g., 1U, 2U, 4U servers, blade servers, etc.). In one embodiment, the body 22 of the IT container 14 also can have a generally cuboid shape, though other shapes or constructions, e.g., cubic, spherical, cylindrical, etc., can be used without departing from the scope of the present disclosure. The IT container 14 can be formed from any suitable materials (e.g., metallic, composite, polymeric, synthetic, materials, etc., or combinations thereof) that are substantially heat resistant and provide long-term compatibility with suitable immersion cooling fluids. The body of the IT container 14 is positioned to be spaced apart from the walls 18 of the body 16 of the immersion tank 12. An immersion cooling fluid 30 can be received in/provided to the interstitial space 31 between the IT container 14 and the immersion fluid tank 12 (FIGS. 2-8). Any suitable cooling fluids suitable for cooling, or other suitable thermal management, of IT equipment/components can be used without departing from the scope of the present disclosure. As shown in FIGS. 1-4, the immersion cooling tank 12 further can have one or more inlets 32 that receive the cooling fluid 30, and one or more outlets 34 that allow the cooling fluid 30 to exit the immersion cooling tank 12, e.g., to facilitate circulation or recirculation of the cooling fluid 30 therethrough.

FIGS. 1-4 additionally show that the thermal management system 10 includes cooling fluid supply loop 36 and a cooling fluid return loop 38. The fluid supply loop 36 can include one or more conduits 40 or other suitable portions defining a fluid flow path that is in communication with the inlet(s) 32 of the immersion cooling tank 12. The conduits 40 of the fluid supply loop 36 further can be in communication with a reservoir or other source of immersion cooling fluid (not shown) for supply of the cooling fluid to the immersion cooling tank 12. The fluid return loop 38 can include one or more conduits 42 or other suitable portions defining a fluid flow path that is in communication with the outlet(s) 34 of the immersion cooling tank 12. The conduits for the fluid supply and return loops 36/38 can be formed from any suitable materials (e.g., metallic, composite, polymeric, synthetic, materials, etc. or combinations thereof) that are verified and compatible for use with the cooling fluid, as well as are substantially heat resistant.

The thermal management cooling system 10 also includes a fluid pump 44, e.g., a constant pump, digital pump, etc., that is configured to drive fluid circulation or recirculation through the immersion cooling tank 12. In one embodiment, the fluid pump 44 is provided along on the return loop 38, e.g., to draw the cooling fluid 30 from the outlet 34 of the immersion cooling tank 12 to facilitate circulation or recirculation of the cooling fluid 30 (FIGS. 1-4). However, the present disclosure is not limited to this arrangement/construction, and the fluid pump 44 can be provided along the supply loop 36, without departing from the scope of the present disclosure. In further alternative constructions, a plurality of pumps or other mechanisms for circulating or recirculating flow of the cooling fluid 30 may be provided along the fluid supply loop 36 or the fluid return loop 38. Additionally, in some embodiments, the fluid supply or fluid return loops can include heat exchangers, or other suitable devices or mechanisms that facilitate heat transfer, provided therealong or otherwise in communication therewith, e.g., to help to control, maintain, change, etc. the temperature of the cooling fluid.

Figure 1:
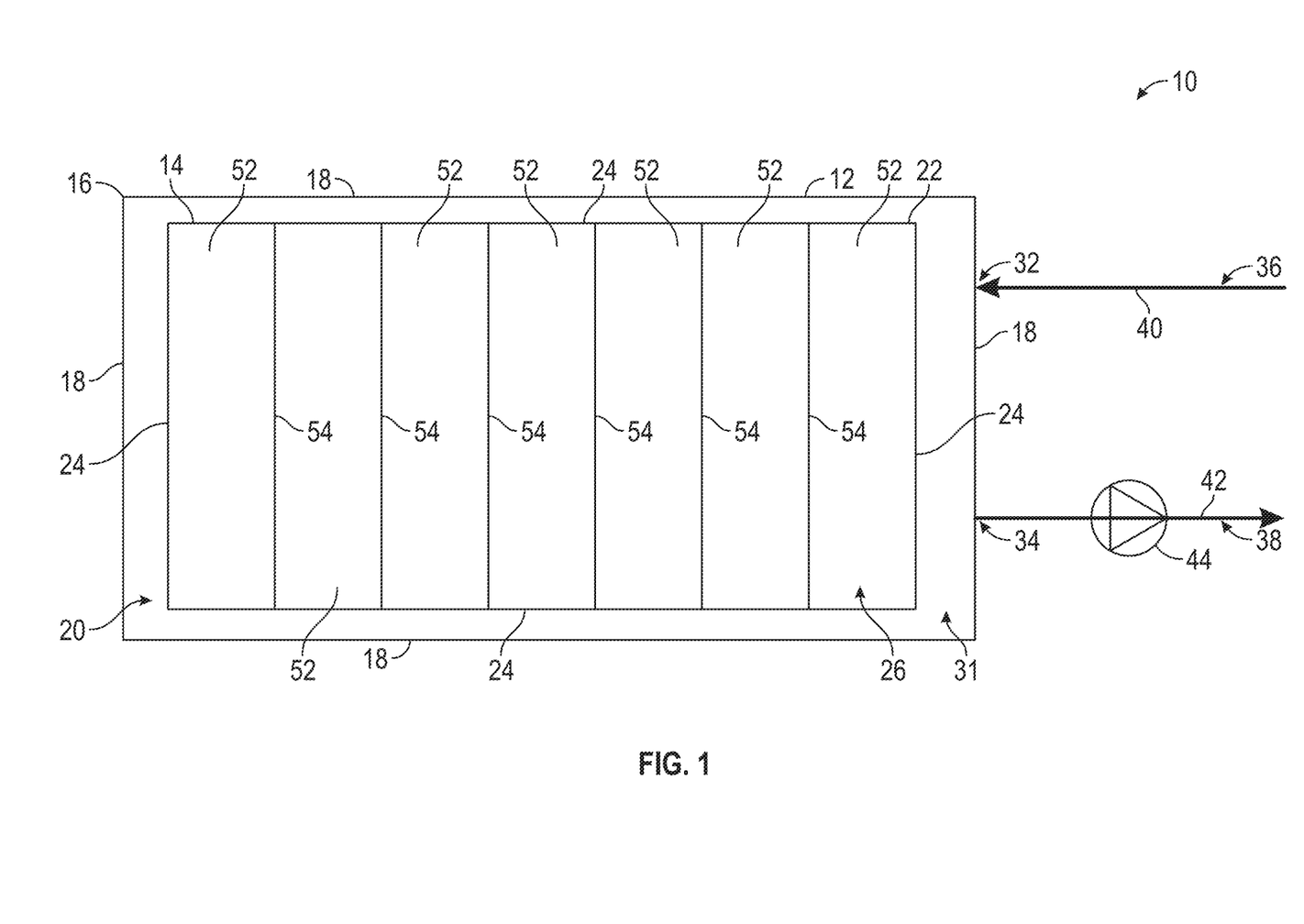
FIG. 1 shows a top, schematic view of an immersion cooling management system according to principles of the present disclosure.
Figure 2:
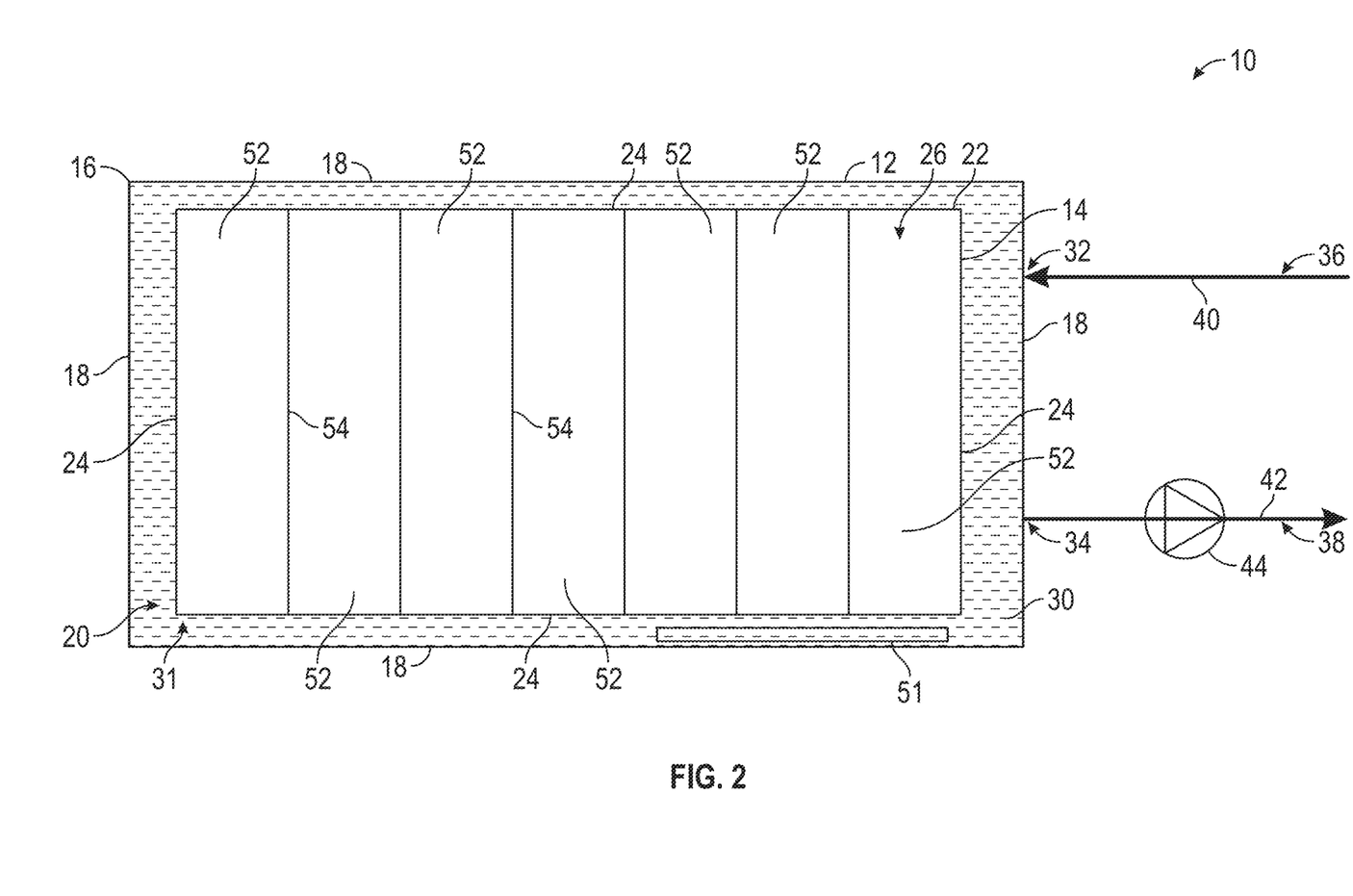
FIG. 2 shows the immersion cooling management system of FIG. 1, with an immersion cooling tank filled with immersion cooling fluid and no IT equipment/components installed.
Figure 3:
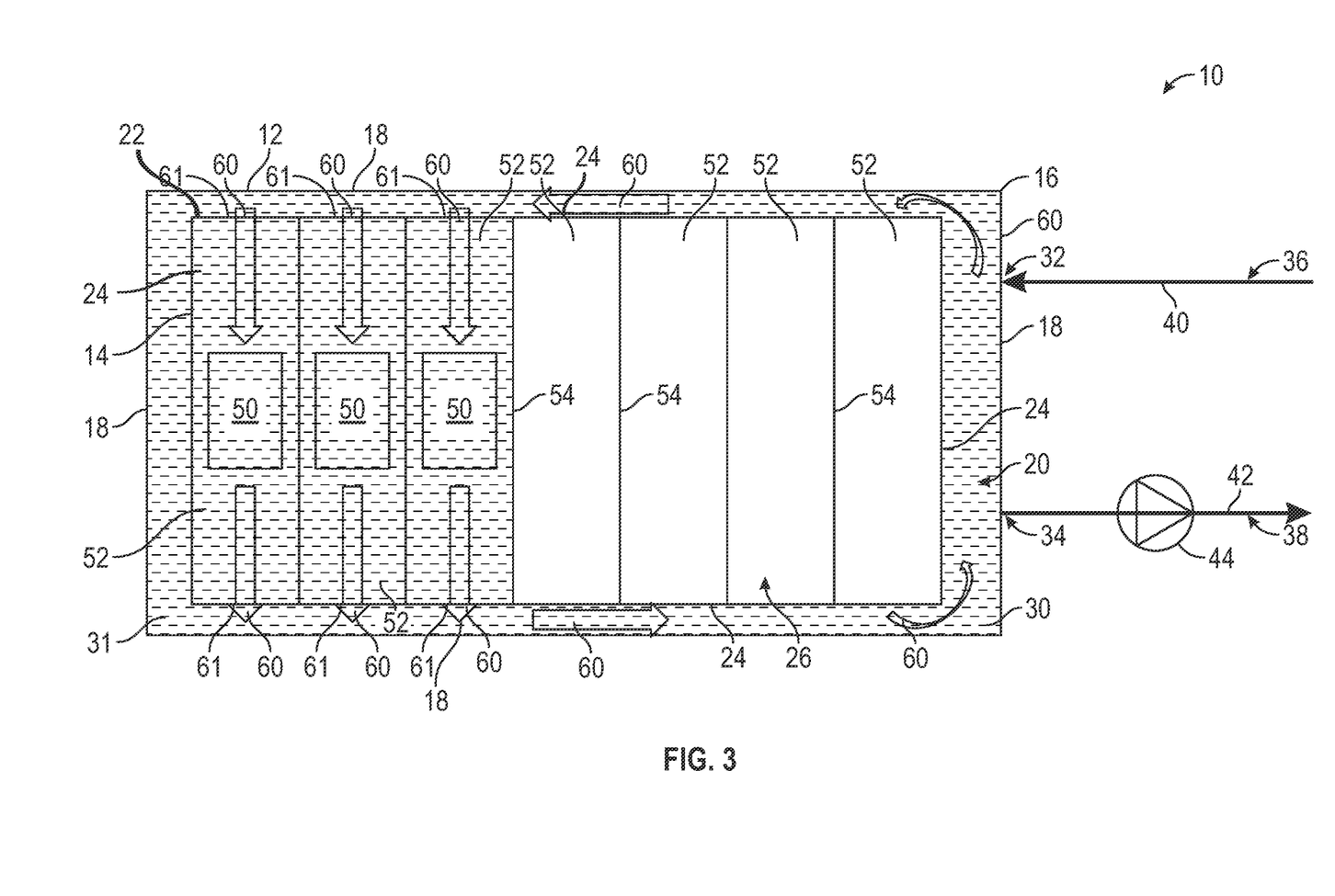
FIG. 3 shows the immersion cooling management system of FIG. 1, with IT equipment/components installed.
Figure 4:
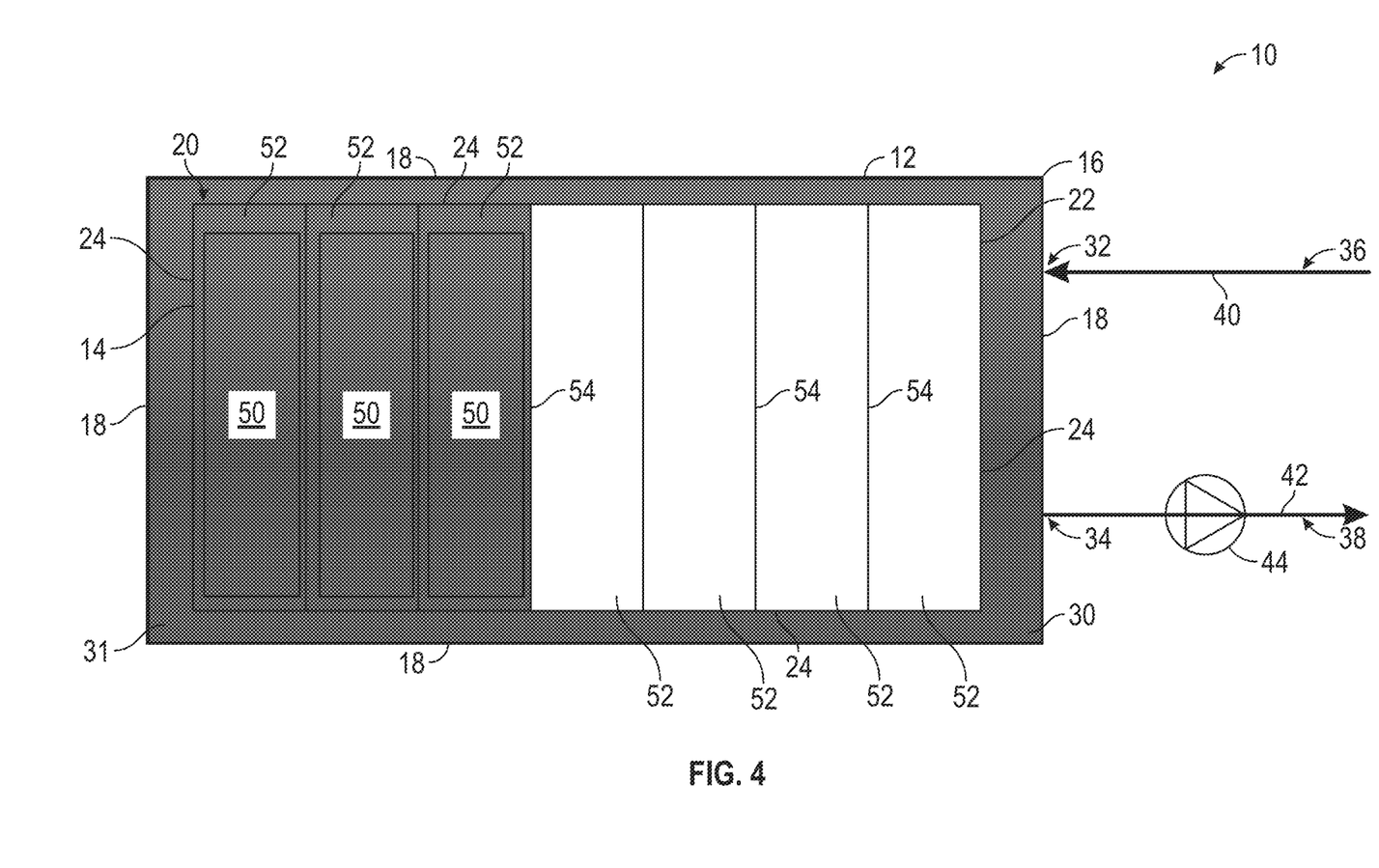

The IT container 14 generally is sized, dimensioned, and/or configured to receive various IT equipment/components 50, as generally shown in FIGS. 3-4. As shown in FIGS. 1-8, the chamber/space 26 of the IT container 14 can be segregated into a plurality of compartments or segregated areas 52 that enable fluid separation within the chamber/space 26. For example, the IT container 14 can include a plurality of fluid segregation panels or portions 54 that are positioned within the chamber/space 26 to define the compartments 52. The segregation panels 54 can be modular or otherwise reconfigurable such that the sizes, dimensions, configurations, etc. of the compartments 52 of the IT container 14 are changeable or reconfigurable, e.g., to accommodate different IT form factors, such as 1U, 2U, 4U, blade servers, etc.

In one embodiment, the cooling fluid 30 can be selectively provided to compartments 52 of the IT container 14 that receive IT equipment/components 50. FIG. 2 provides a schematic, top view of the immersion cooling system 10, with the immersion cooling tank 12 filled with fluid, but no IT equipment/components 50 installed in the IT container 14. As shown in FIG. 2, the chamber 20 of the immersion cooling tank 12 is filled with/receives the cooling fluid 30 (e.g., the cooling flows through the interstitial space 31), but as no compartments 52 of the IT container 14 have IT equipment/components 50 installed therein, the cooling fluid 30 is not received in/provided to any of the compartments 52. However, as FIG. 2 additionally shows, other IT equipment/components 51, such as network gears, PSUs, battery units, cables, rack management controllers, etc. can be positioned/received within the interstitial space 31 between the immersion tank 12 and the IT container 14, for thermal management of these additional components 51.

FIG. 3 shows a schematic view of the immersion cooling system 10, when IT equipment is installed in several compartments 52 of the IT container 14. As shown in FIG. 3, the cooling fluid 30 is selectively provided to compartments 52 of the IT container 14 that have IT equipment/components 50 installed therein. In FIG. 3, the first three compartments 52 of the IT container 14 from the left have IT equipment/components 50 installed therein and thus are provided and filled with the cooling fluid 30, while the other, remaining compartments 52 do not receiving the cooling fluid 30. For example, when a compartment 52 of the IT container 14 receives IT equipment/components 50, a corresponding fluid flow channels or fluid flow opening 61 can be opened/activated to provide fluid to the component.

FIG. 3 shows example fluid circulation fluid paths 60 according to principles of the present disclosure. As shown in FIG. 3, the cooling fluid 30 is supplied through the fluid supply loop 36 (e.g., from a reservoir, supply, source, etc. of the cooling fluid) so as to enter the immersion cooling tank 12 at its inlet 32. The cooling fluid 30 then passes through the interstitial space 31 and the compartments 52 of the IT container 14 (e.g., through the fluid flow openings 61 defined along the portions or walls 24 of the IT container 14), which are populated with IT equipment/components 50, and the cooling fluid exits the immersion cooling tank 12 at its outlet 34 into the fluid exit loop 38. From the fluid exit loop 38, the cooling fluid 30 can be recirculated into the fluid reservoir, source, supply, etc. of cooling fluid, though the fluid exit loop 38 can be in fluid communication with the fluid supply loop 36 and the cooling fluid can be directed therefrom to the fluid supply loop 36, without departing from the scope of the present disclosure. As shown in FIG. 3, each compartment 52 will have a plurality of corresponding fluid flow openings 61 that are configured to allow the cooling fluid 30 to flow through each compartment 52. In one embodiment, each compartment 52 can have a pair of opposing openings 61 defined in opposing walls or portions 24 of the IT container 14, though other arrangements or constructions are possible, e.g., openings can be provided in adjacent walls or sections 24, without departing from the scope of the present disclosure.

FIG. 4 shows one possible example of thermal conditions within the immersion cooling tank 12, when IT equipment/components 50 are installed and powered on. As shown in FIG. 4, when the IT equipment is powered on, the portions of the cooling fluid 30 that enter from the inlet 32 and initially flow along the sides/sections of immersion tank 12 and IT container 14 adjacent the inlet 32 are significantly cooler than the portions of the cooling fluid 30 that are flowing along the opposing sides/sections of the immersion tank 12 and IT container 14. It further can be seen that the thermal conditions within the IT container are highly dependent on the selected fluid management method, i.e., different fluid flow management techniques may form various thermal patterns with in the immersion cooling tank, and the cooling fluid 30 generally needs to be circulated or recirculated sufficiently to manage/maintain the temperature thereof, e.g., to provide a proper thermal environment to all of the IT equipment/components populated in the tank, while also attempting to use minimal energy, as discussed further below.

Figure 5:
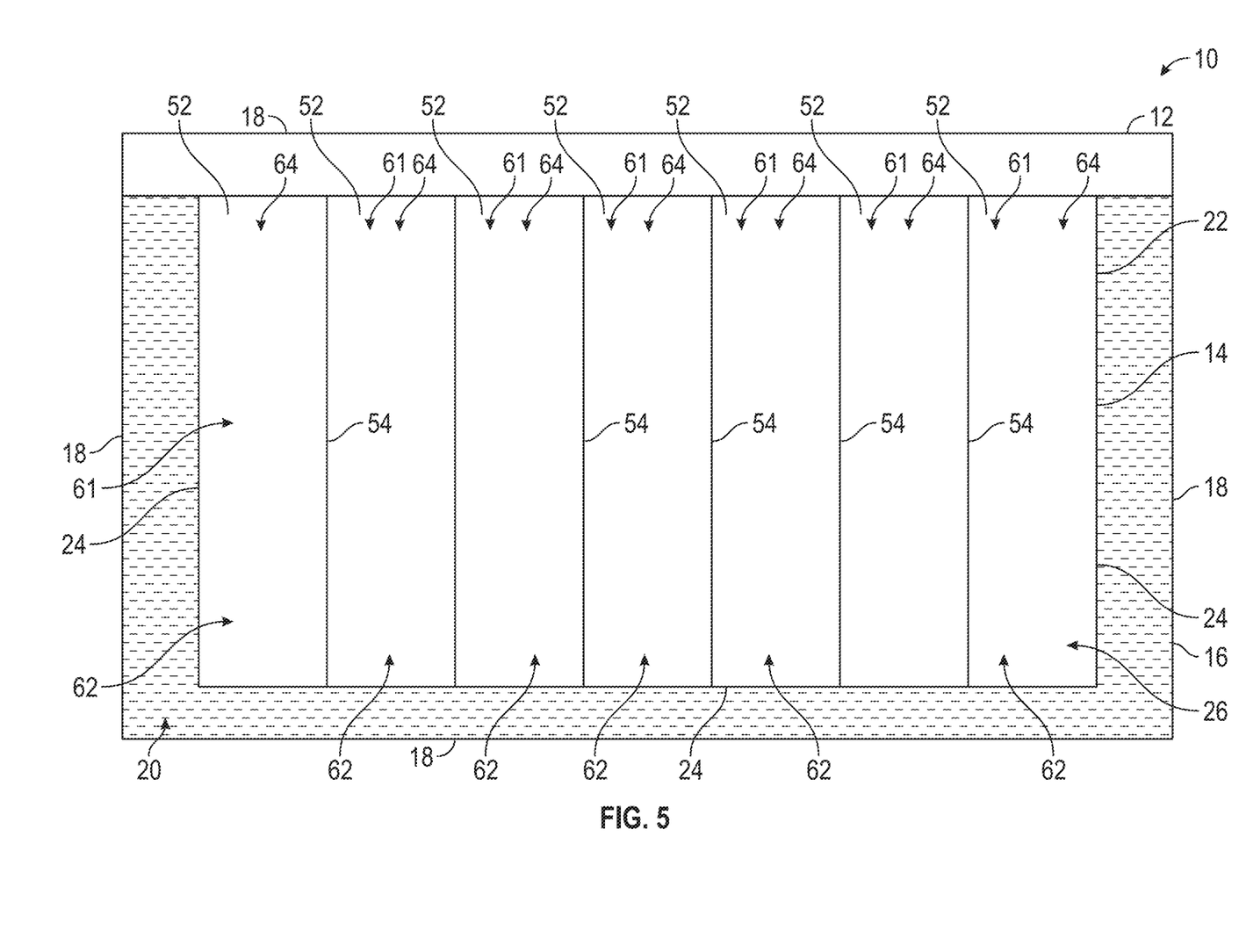
FIG. 5 shows a side view of the immersion cooling management system of FIG. 1.
Figure 6:
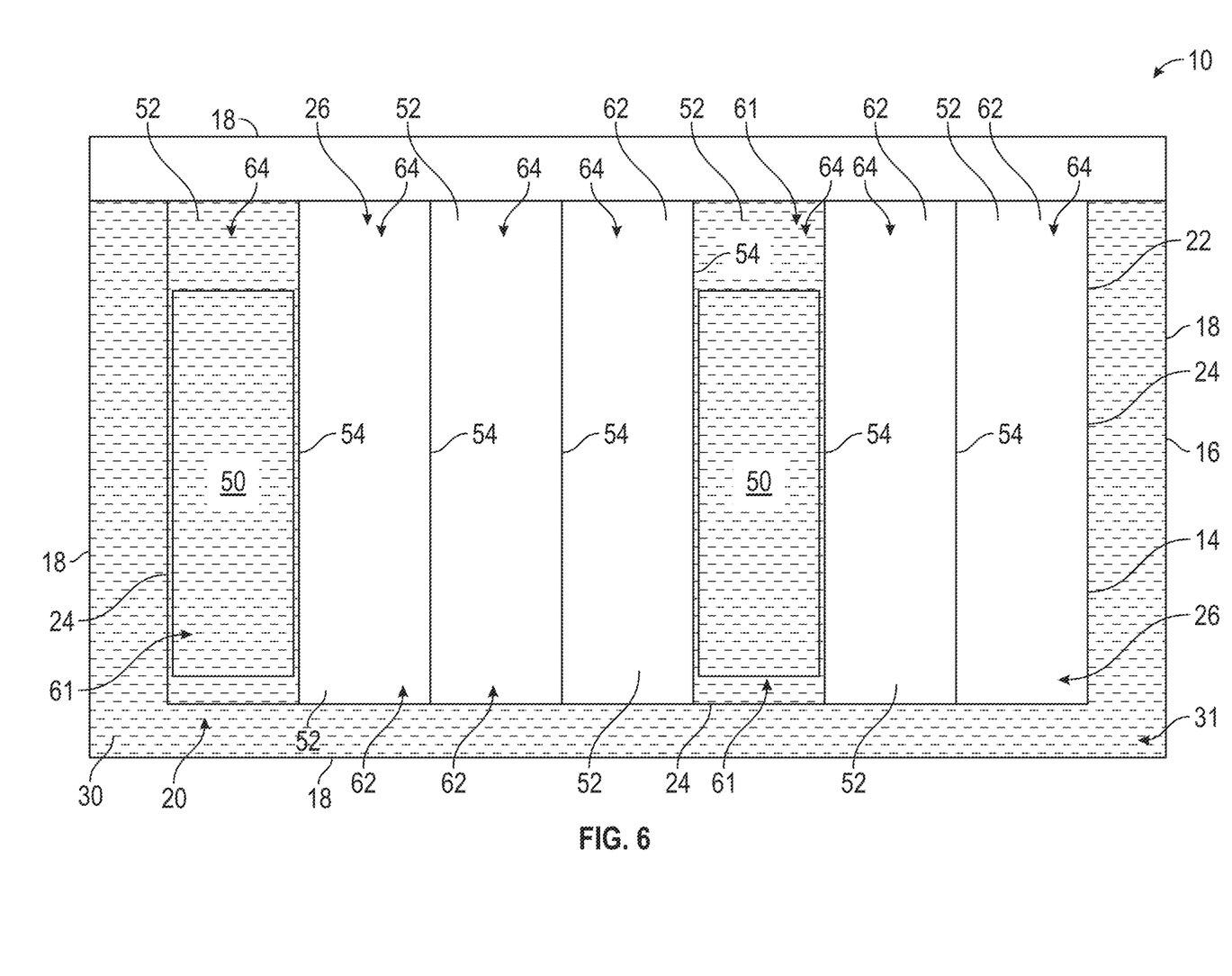
FIG. 6 shows a side view of the immersion cooling management system of FIG. 1, with IT equipment/components installed.

FIGS. 5 and 6 show side views of the immersion cooling system 10 according to principles of the present disclosure. As shown in FIGS. 5-6, the portions or walls 24 of the IT container 14 have fluid gates 62 corresponding to the fluid flow openings 61 and configured to be selectively opened and closed to cover and uncover the openings 61 to allow and prevent the cooling fluid 30 to flow into the various compartments 52 of the IT container 14. For example, when the IT equipment/components 50 are installed in one or more of the compartments 52, the corresponding fluid gates 62 can be opened, either manually or automatically, to allow circulation of the cooling fluid 30 into the one or more compartments 52 receiving the IT equipment/components 50. In one embodiment, as shown in FIGS. 5 and 6, the fluid gates 62 can include sections or portions 64 of the walls 24 of the IT container 14 that can be removed when IT equipment/components 50 are installed in corresponding compartments 52. For example, an operator of the thermal management system 10 can manually remove select portions 64 that correspond to compartments 52 with IT equipment/components 50 installed therein, though the portions 64 can be automatically moved/removed to uncover corresponding openings, e.g., using one or more motors, actuators, etc., without departing from the scope of the present disclosure. FIG. 5 shows the immersion cooling system 10 with all removable portions 64 in place, such that no cooling fluid 30 flows through the compartments 52, e.g., because no IT equipment/components 50 are installed in any of the compartments 52. As shown in FIG. 6, on the other hand, the removable portions 64 that correspond to compartments 52 with IT equipment/components 50 installed/received therein are removed or otherwise opened to uncover the corresponding fluid flow openings 61 and allow the cooling fluid 30 to pass into and fill the compartments 52 receiving IT equipment/components 50, e.g., to facilitate cooling/thermal management of the IT equipment/components 50.

Figure 7:
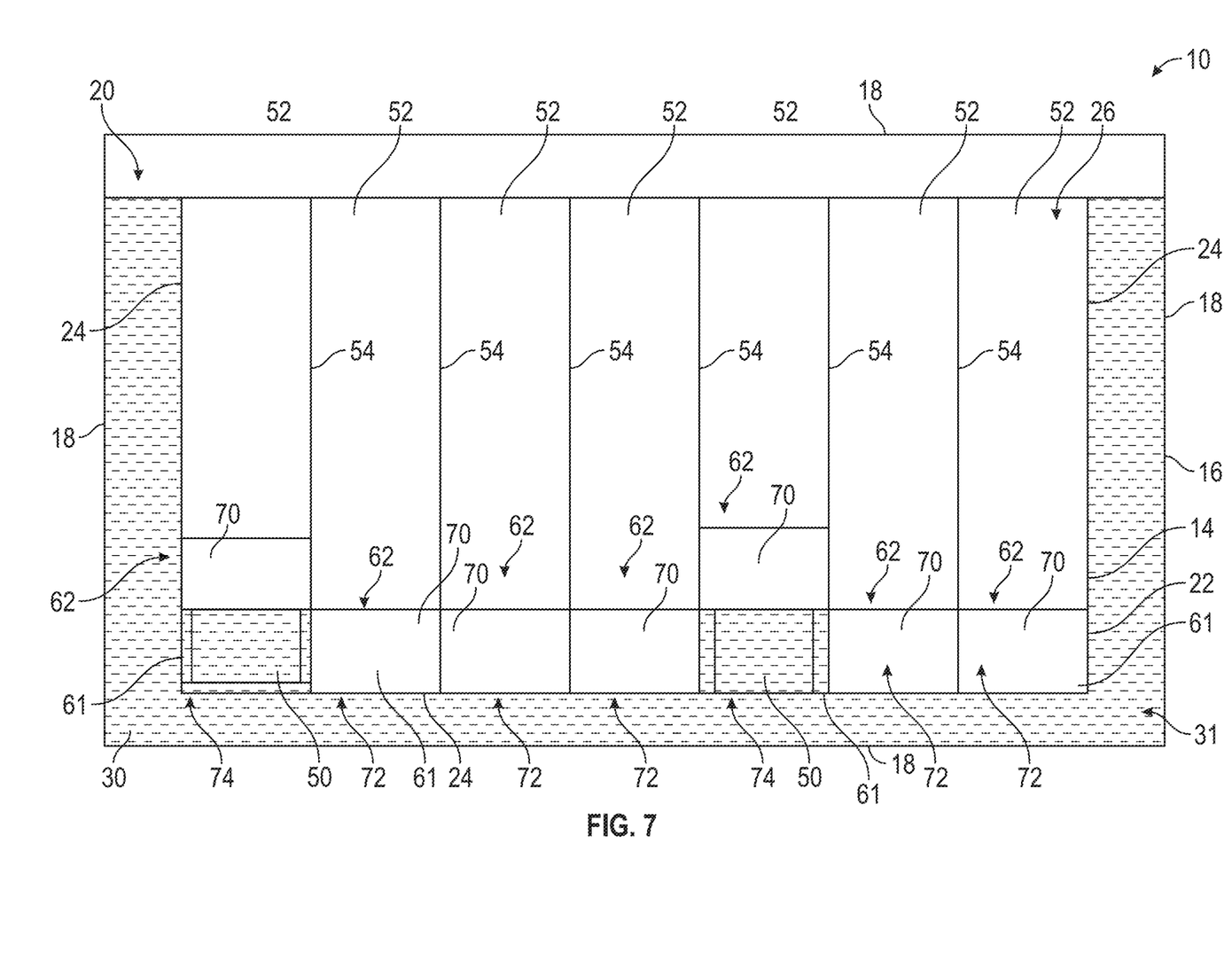
FIG. 7 shows a side view of the immersion cooling management system of FIG. 1, illustrating fluid inlet gates according to one aspect of the present disclosure.

FIG. 7 shows a side view of the immersion cooling system 10 illustrating an alternative construction for the fluid gates 62. As shown in FIG. 7, in one embodiment, the fluid gates 62 include moveable portions/sections 70 provided along walls/portions 24 of the IT container 14 to correspond to each of the fluid flow openings 61 defined therein. For example, the portions/sections 70 can slide or otherwise translate between a first, closed position 72 covering the openings 61 and a second, open position 74 uncovering the openings 61 to allow the cooling fluid 30 to flow therethrough. FIG. 7 shows that the sliding portions/sections 70 will be in the closed position 72 when no IT equipment/components 50 are installed in the compartments 52, and further shows that, when IT equipment/components 50 are installed into one or more compartments 52, the corresponding portions/sections 70 are slid or otherwise translated to their an open position 74 to allow the cooling fluid 30 to enter, fill, and circulate through the corresponding compartments 52. In one embodiment, the immersion cooling system 10 can include one or more motors, actuators, etc. in communication with the portions/sections 70 and configured to automatically move the portions/sections 70 between the open and closed positions 72/74, though the portions/sections 70 can be manually slid or translated, e.g., by activation of levers, handles, etc. operatively attached thereto, without departing from the scope the present disclosure.

Figure 8:
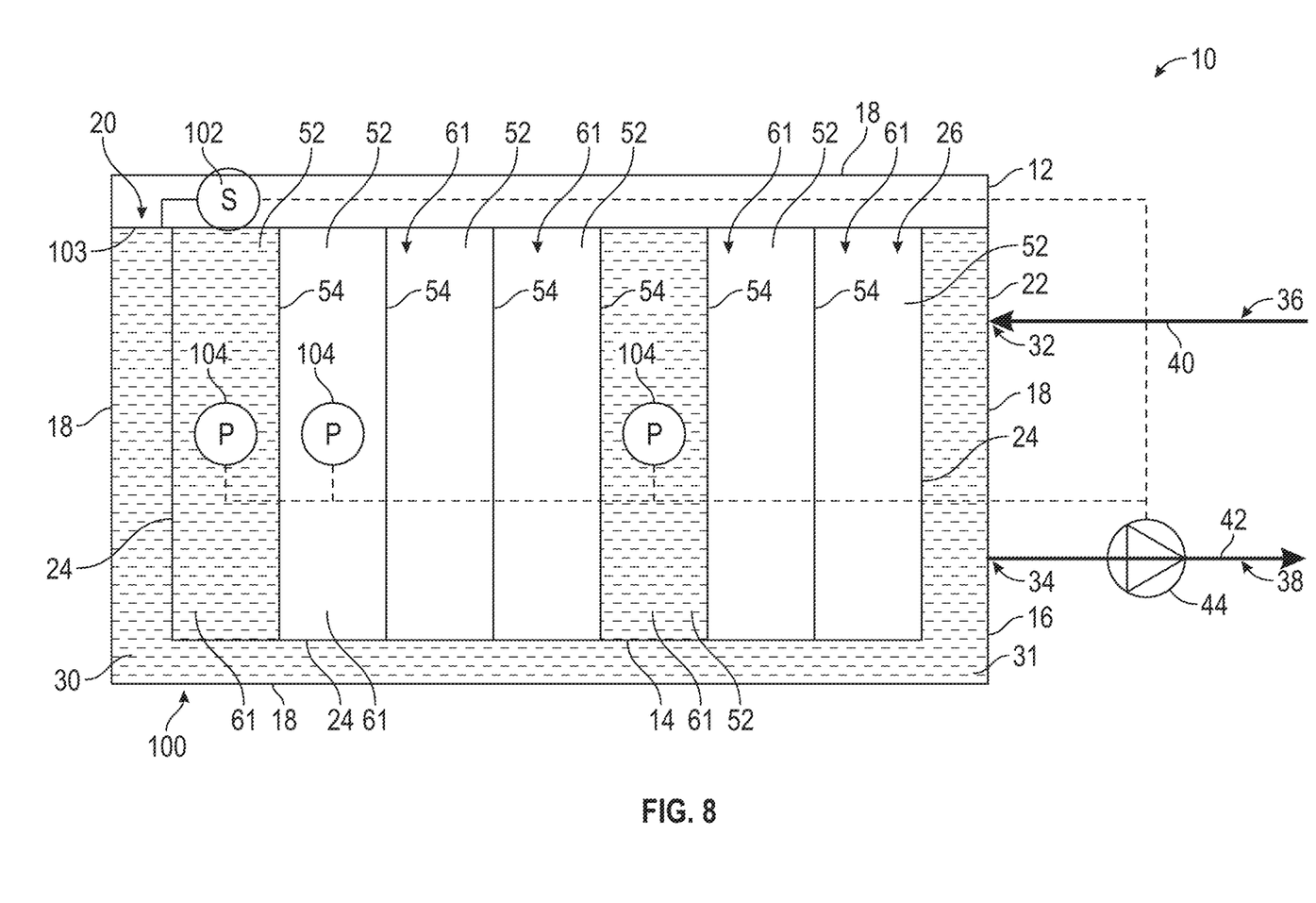
FIG. 8 shows a schematic view of a control system for the immersion cooling management system according to one aspect of the present disclosure.

FIG. 8 shows a fluid control system 100 for the immersion cooling system 10 according to one embodiment of the present disclosure. As shown in FIG. 8, the control system 100 includes at least one fluid level sensor 102 received along the immersion tank 12 and configured to facilitate monitoring the fluid level 103 of the cooling fluid 30 within the immersion tank 12. For example, the fluid level sensor(s) 102 can be configured to gather or capture information related to the fluid level 103 within the immersion tank 12. As further shown in FIG. 8, the control system 100 also includes a plurality of pressure sensors 104 configured to facilitate monitoring the fluid pressure of the cooling fluid at the openings 61 of the compartments 52. For example, one or both of the openings 61 of the components 52 can have a corresponding fluid pressure 104 sensor that gathers or captures information related to a fluid pressure therealong.

In operation, with IT equipment/components installed, the sensors 102 and 104 can gather information, e.g., relating to fluid level and fluid pressure, and can generate control signals to control operation of the fluid pump 44. For example, operation speed of the fluid pump 44 can be adjusted, e.g., the pump's 44 operating speed can be adjusted or the pump 44 can be activated/deactivated, to control and maintain desired/predetermined fluid levels and pressure conditions. In one embodiment, the control system 100 can be configured to control the fluid pump 44 to maintain or change the flow of the cooling fluid 30 to maintain a substantially constant fluid level and/or a substantially constant fluid pressure, e.g., to help to maintain a desired temperature of the cooling fluid 30 or the IT equipment/components 50. Accordingly, the control system 100 can help to facilitate energy efficiency, fluid usage efficiency, better fluid management, precision system control, as well as ease of service and maintenance for the immersion cooling system.

In one embodiment, the control system 100 can include one or more processors, controllers, etc. (not shown) that are in communication with the sensors 102 and 104, and in communication with the fluid pump 44. The processor(s) can receive information gathered from the sensors 102 or 104 and can execute software, workflows, etc., (e.g., accessed from one or more memories in communication with the processor(s)) to determine a fluid level or fluid pressure and further to generate and send control signals to the pump (e.g., to stop, vary, or maintain the speed of the pump) based on the determined fluid level or fluid pressures. However, in alternative constructions, or in addition, the sensors 102/104 can be in direct communication with the fluid pump 44 to control operation thereof, e.g., if the fluid level or fluid pressure is at, below, or above a threshold value, without departing from the scope of the present disclosure.

The present disclosure also provides a method for immersion cooling thermal management, e.g., inside the immersion tank 12. For example, the method can include circulating, using the pump 44, the cooling fluid 30 though the chamber 20 of the immersion tank 12. The method also can include providing IT equipment/components 50 to at least one compartment 52 of the IT container 14. Upon providing the IT equipment/components 50 to the at least one compartment 52 of the IT container 14, the method includes opening one or more fluid gates 62 to allow the cooling fluid 30 to flow from the chamber 20 of the immersion tank 12 into the at least one compartment 52 of the IT container 14. The method also can include gathering, using one or more sensors 102, information related to the fluid level 103 of the cooling fluid 30 in the chamber 20 of the immersion tank 12, and gathering, using one or more sensors 104, information related to a fluid pressure of the cooling fluid 30 in the at least one compartment 52 of the IT container 14. In addition, the method can include controlling the pump 44 to circulate the cooling fluid 30 such that the fluid level or the fluid pressure is substantially maintained or substantially constant.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. An immersion cooling system for information technology (IT) components, comprising:

an immersion tank including a body defining a chamber that receives a cooling fluid, the body of the immersion tank having an inlet and an outlet defined therein to facilitate circulation of the cooling fluid through the chamber;

a pump in communication with the inlet or outlet of the immersion tank and configured to circulate fluid therethrough;

an IT container that is at least partially received within the chamber of the immersion tank, and includes a body with at least one compartment defined therein and configured to receive one or more IT components, the body of the IT container comprising a corresponding plurality of openings in communication with the at least one compartment and providing a fluid passage therethrough to selectively allow the cooling fluid to flow through the at least one compartment, the plurality of openings located inside the at least one compartment;

a plurality of fluid gates corresponding to the plurality of openings of the body of the IT container, the plurality of fluid gates including one or more portions that are movable between a closed position preventing the cooling fluid from passing through the openings, and an open position that allows the cooling fluid to pass through the openings and through the at least one compartment; and a control system in communication with the pump, and including one or more sensors positioned to gather information related to an aspect of the cooling fluid, the control system is configured to control the pump to alter fluid flow of the cooling fluid based on the aspect of the cooling fluid.

2. The immersion cooling system of claim 1, wherein the one or more sensors include a fluid level sensor positioned within the immersion tank, and the aspect of the cooling fluid includes a fluid level of the immersion tank.

3. The immersion cooling system of claim 1, wherein the one or more sensors include a pressure sensor positioned along the at least one compartment of the IT container, and the aspect of the cooling fluid includes a fluid pressure in the at least one compartment of the IT container.

4. The immersion cooing system of claim 1, wherein when the at least one compartment does not contain IT components, the fluid gates are in the closed position such that the cooling fluid does not flow through the at least one compartment, and wherein when the at least one compartment receives one or more IT components, the fluid gates are moved to the open position to allow the cooling fluid to flow through the at least one compartment for cooing of the one or more IT components.

5. The immersion cooling system of claim 1, wherein the body of the IT container includes a plurality of compartments defined therein, wherein the plurality of compartments are defined by a plurality of segregation portions.

6. The immersion cooling system of claim 5, wherein the plurality of segregation portions are modular or reconfigurable such that the plurality of compartments can have different sizes, dimensions, or configurations to accommodate various types of IT equipment.

7. The immersion cooling system of claim 1, wherein the IT container is arranged within the chamber of the immersion tank such that the body of IT container is spaced apart from at least a portion of the body of the immersion tank to define an interstitial space, and wherein the cooling fluid is received within the interstitial space between the body of the IT container and the body of the immersion tank.

8. The immersion cooling system of claim 1, wherein additional IT components are received within the interstitial space between the body of the IT container and the body of the immersion tank.

9. The immersion cooling system of claim 8, wherein the additional IT components include network gears, PSUs, battery units, rack management controllers, or combinations thereof.

10. The immersion cooling system of claim 1, wherein the one or more IT components received in the at least one compartment of the IT container include 1U servers, 2U servers, 4U servers, blade servers, or combinations thereof.

11. An immersion cooling system for thermal management of information technology (IT) components, comprising:

an immersion tank including a body defining a chamber that receives a cooling fluid, a cooling fluid supply loop in communication with chamber of the immersion tank providing the cooling fluid thereto;

a cooling fluid return loop in communication with the chamber of the immersion tank allowing the cooling fluid to exit the chamber of the immersion tank to facilitate circulation of the cooling fluid therethrough;

a pump in communication with the cooling fluid return loop and configured to drive circulation of the cooling fluid through the chamber of the immersion tank;

an IT container that is at least partially received within the chamber of the immersion tank, and includes a body with a plurality of compartments defined therein and each configured to receive one or more IT components, the body of the IT container further includes a plurality of openings defined therein and corresponding to the plurality of compartments to selectively allow the cooling fluid to flow through plurality of compartments, each of the plurality of openings located inside a corresponding compartment of the plurality of compartments; a plurality of fluid gates corresponding to the plurality of openings of the body of the IT container, the plurality of fluid gates including one or more portions that are movable between a closed position preventing the cooling fluid from passing through the plurality of openings, and an open position that allows the cooling fluid to pass through the plurality of openings and through the plurality of compartments; and a control system in communication with the pump, the control system including a fluid level sensor positioned to gather information related to a fluid level of the cooling fluid in the chamber of the immersion tank, and a plurality of pressure sensors positioned along the plurality of compartments to gather information related to a fluid pressure of the cooling fluid in the plurality of compartments, the control system is configured to control the pump to alter flow of the cooling fluid based the fluid level of the cooling fluid in the chamber of the immersion tank or the fluid pressure in the plurality of compartments.

12. The immersion cooling system of claim 11, wherein when at least one compartment of the plurality of compartments does not contain IT components, one or more fluid gates of the plurality of fluid gates that correspond to one or more openings of the plurality of openings corresponding to the at least one compartment that does not contain IT components are in the closed position such that the cooling fluid is prevented from flowing through the at least one compartment that does not contain IT components, and wherein when at least one compartment contains one or more IT components, one or more fluid gates of the plurality of fluid gates that correspond to one or more openings of the plurality of openings corresponding to the at least one compartment that contains IT components are in the open position to allow the cooling fluid to flow through the at least one compartment for cooling of the one or more IT components.

13. The immersion cooling system of claim 11, wherein the IT container includes a plurality of segregation portions that at least partially define the plurality of compartments.

14. The immersion cooling system of claim 13, wherein the plurality of segregation portions are modular or reconfiguration such that the plurality of compartments are reconfigurable to have different sizes, dimensions, or configurations to accommodate various types of IT equipment.

15. The immersion cooling system of claim 11, wherein the IT container is arranged within the chamber of the immersion tank such that the body of IT container is spaced apart from at least a portion of the body of the immersion tank, and wherein the cooling fluid is received within the interstitial space between the body of the IT container and the body of the immersion tank.

16. The immersion cooling system of claim 15, wherein additional IT components are received within the interstitial space between the body of the IT container and the body of the immersion tank.

17. The immersion cooling system of claim 11, wherein the one or more IT components received in the at least one compartment of the IT container include 1U servers, 2U servers, 4U servers, blade servers, or combinations thereof.

18. A method for thermal management of IT components, comprising:
- circulating, using a pump, a cooling fluid though a chamber of an immersion tank;
- providing one or more IT components to at least one compartment of an IT container that is received within an immersion tank;
- upon providing the one or more IT components to the at least one compartment of the IT container, opening one or more fluid gates of a corresponding plurality of openings to selectively allow the cooling fluid to flow from the chamber of the immersion tank into the at least one compartment of the IT container and flow out of the at least one compartment, the corresponding plurality of openings located inside the at least one compartment, the one or more fluid gates including one or more portions that are movable between a closed position preventing the cooling fluid from passing through the plurality of openings, and an open position that allows the cooling fluid to pass through the plurality of openings and through the plurality of compartments;
- gathering, using one or more sensors, information related to a fluid level of the cooling fluid in the chamber of the immersion tank;
- gathering, using one or more sensors, information related to a fluid pressure of the cooling fluid in the at least one compartment of the IT container,
- controlling the pump to circulate the cooling fluid through the chamber of the immersion container and the at least one compartment of the IT container such that the fluid level or the fluid pressure is substantially constant.

\* \* \* \* \*